United States Patent [19]

Coleman

[11] Patent Number: 4,506,211

[45] Date of Patent: * Mar. 19, 1985

[54] STORM WARNING METHOD AND APPARATUS

[76] Inventor: Ernest W. Coleman, 1465 Sinkler Rd., Warminster, Pa. 18974

[ * ] Notice: The portion of the term of this patent subsequent to Dec. 20, 2000 has been disclaimed.

[21] Appl. No.: 516,288

[22] Filed: Jul. 22, 1983

Related U.S. Application Data

[63] Continuation of Ser. No. 235,168, Feb. 17, 1981, Pat. No. 4,422,037.

[51] Int. Cl.³ .................................................. G01W 31/02
[52] U.S. Cl. ..................................... 324/72; 324/77 R
[58] Field of Search ................... 324/72, 72.5, 77 R; 73/170 R

[56] References Cited

U.S. PATENT DOCUMENTS

| | | | |
|---|---|---|---|
| 3,715,660 | 2/1973 | Ruhnke | 324/72 |
| 4,023,408 | 5/1977 | Ryan et al. | 324/72 |
| 4,115,732 | 9/1978 | Krider et al. | 324/72 |
| 4,156,182 | 5/1979 | Brick et al. | 324/72 |
| 4,198,599 | 4/1980 | Krider et al. | 324/72 |
| 4,245,190 | 1/1981 | Krider et al. | 324/72 |
| 4,383,260 | 5/1983 | Ryan | 343/701 |
| 4,422,037 | 12/1983 | Coleman | 324/72 |

OTHER PUBLICATIONS

Uman et al., "Magnetic Field of Lightning Return Stroke" Journal of Geophysical Research, vol. 74, No. 28, 12/20/69, pp. 6899-6909.
Ruhnke, "Determining Distance to Lightning Strokes from a Single Station: NOAA TR E RL 195-APCL 16 1/1971, pp. 20-23.
Fisher et al., "Measured Electric Field Risetimes for First and Subsequent Lighning Return Strokes," Journal of Geophysical Research, vol. 77, No. 3, 1/20/72.
Uman et al., "Correlated Electric and Magnetic Fields from Lightning Return Strokes" Journal of Geophysical Research, vol. 80, No. 3, 1/20/75, pp. 373-376.
Brantley et al., "Lightning Properties in Florida Thunderstorms from Video Tape Records" Journal of Geophysical Research, vol. 80, No. 24, 8/20/75, pp. 3402-3406.

(List continued on next page.)

*Primary Examiner*—Michael J. Tokar
*Attorney, Agent, or Firm*—Benasutti and Murray

[57] ABSTRACT

An apparatus and method of detecting, tracking and displaying lightning activity is disclosed. A lightning stroke has associated therewith electric and magnetic field components characterized by maximum rise times and minimum power levels. The field signals comprise a plurality of sub pulses also. An electric field antenna and a pair of magnetic field antennas are disposed to receive the field components associated with lightning activity. Control circuitry cooperating with rise time and threshold measuring which operates on the field signals received by the antennas generates control signals including integration and sampling control signals for integrating the electric and magnetic field signals over a predetermined time interval (preferable one hundred microseconds) and for sampling and holding the field signals at each of the sub pulse peaks. Preprocessing circuitry upon command from a programmable microprocessor A to D converts the integrated and sampled field components where they are stored as digital data in FIFO memories. In response to control signals from the control circuitry the microprocessor transfers the digital data from the FIFO memories to its own memory whereupon it determines the azimuth and elevation angles to the lightning activity based on the sampled field data and determines the range based on the ratio of the magnetic to electric field components using the integrated values of the magnetic and electric fields. The angle and range information is transmitted to a display processor and display where it can be displayed in a variety of formats. Where the apparatus is mounted in an aircraft, the speed of the aircraft and changes in heading are factors into the determination and display of the angles and range.

11 Claims, 11 Drawing Figures

OTHER PUBLICATIONS

Krider et al., "Broadband Antenna Systems for Lightning Magnetic Fields" Journal of Applied Meteorology, vol. 14, 3/75, pp. 252-255.

Krider et al., "A Gated, Wideband Magnetic Direction Finder for Lightning Return Strokes," Journal of Applied Meteorology, vol. 15, 3/76, pp. 301-306.

Herrman, et al., "Test of the Principle of Operation of a Wideband Magnetic Direction Finder for Lightning Return Strokes Journal of Applied Meteorology, vol. 15, 4/76, pp. 402-405.

"Lightning Test Waveforms and Techniques for Aerospace Vehicles and Hardware, Report of SAE Committee AE-4 Special Task F, May 5, 1976, pp. 2-3.

Livingston et al., "Electric Fields Produced by Florida Thunderstorms", vol. 83, No. C1, 1/20/78, pp. 385-401.

Krider et al., "The Electric Fields Produced by Lightning Stepped Leaders," vol. 82, No. 6, 2/20/77, pp. 951-960.

Leise et al., "A Transmission Line Model with General Velocities for Lightning," vol. 82, No. 3, 1/20/77, pp. 391-396.

Taylor, "A VHF Technique for Space-Time Mapping of Lightning Discharge Process", Journal of Geophysical Research, vol. 83, No. C7, 7/20/78, pp. 3575-3583.

Wong et al., "The Inclination of Intracloud Lightning Discharges," Journal of Geophysical Research, vol. 83, No. C4, 4/20/78, pp. 1905-1912.

Krider et al., "Lightning Detection Systems for Fire Management, Fifth Joint Conference on Fire and Forest Meteorology, Mar. 14-16, 1978.

Weidman, et al., "Submicrosecond Risetimes in Lightning Radiation Fields," NASA Conference Publication 2128, FAA-RD-80-30, 5/22/80, pp. 29-38.

Baum, et al., "In-Flight Evaluation of a Severe Weather Avoidance System for Aircraft," AFWAL-TR-80-3022, May 1980, pp. 55-57.

Rozelle, "Alternative to Radar," The AOPA Pilot, 11/1979, pp. 96-104.

Baum, et al., "Measurement of Electromagnetic Properties of Lightning with 10 Nanosecond Resolution," NASA Conference Publication 2128 FAA-RD-80-30, Apr. 22, 1980, pp. 39-66.

STORM WARNING METHOD AND APPARATUS

This is a continuation of U.S. patent application Ser. No. 235,168, filed Feb. 17, 1981, now U.S. Pat. No. 4,422,037.

BACKGROUND OF THE INVENTION

This invention relates to an apparatus and method for displaying regions of lightning activity.

Thunder storms characterized by turbulence and electrical activity (lightning) create great dangers particularly to air travel. It is therefore desirable to locate thunder storm activity as accurately as possible so that thunder storms can be tracked, predicted and avoided. Lightning associated with the mature stages of thunder storms generates electrical signals that propagate through the atmosphere. The detection, recognition, accurate measurement and analysis of these electrical signals provide a basis for storm tracking, avoidance, etc.

Lightning flashes are composed of a series of high current lightning strokes, each stroke being preceeded by a lower current discharge called a leader. The duration of electrical activity associated with a lightning stroke varies but in many instances last as much as a hundred microseconds. The initial rise time of electrical signals associated with a lightning stroke almost never exceeds five microseconds. Following the first peak of the electrical signals of a lightning stroke, lesser signals of sub-microsecond duration but with fast rise times (of five microseconds or less) will occur.

U.S. Pat. No. 4,023,408 discloses a storm mapping system which detects electrical activity caused by weather phenomenon such as lightning strokes. The system is intended to operate on the far field (or radiation field) pattern generated by the lightning stroke. According to the disclosure, the far field pattern is characterized mainly by a low frequency spectrum with maximum amplitude signals occuring between seven and seventy three kilohertz (KHZ). A trio of antenna sensors, an electric field antenna and two crossed magnetic field antennas, are used and each is connected to a tuned receiver on a center frequency of fifty KHz. The crossed loop magnetic field antennas are used to locate the lightning signals in azimuth angle by comparing the relative magnitude of the signals induced in the cross loop sensors to the electric field antenna in a conventional manner. The magnetic field signals are time correlated with the electric field signals before integration. This provides some measure of avoiding unwanted noise like signals. Integration of the correlated signals is formed for 0.5 milliseconds but only after the vector sum of the magnetic field sensor signals is found to exceed a predetermined threshold value. The algebraic sum of the magnetic field sensor signals is amplified and then squared. This signal is used to divide the integrator output signals thereby reducing the magnitude of larger correlated integrated signals below the magnitude of smaller ones. These inverted signals then drive a display such as a CRT display to show larger signals closer to the observation point and smaller signals farther away.

This system has been used on aircraft and appears to work well, but it depends heavily on the magnitude of correlated electric and magnetic field signals to provide a measure of the range of the signal from the observation point of the equipment. Accordingly, the accuracy of range estimates may be affected by the variation in the severity of the thunder storms. Also, some of the detailed characteristics of lightning stroke signals are not utilized to discriminate between interfering signals and true lightning electrical signals.

The Ruhnke U.S. Pat. No. 3,715,660, discloses an apparatus for determining the distance to lightning strokes. It does not measure or calculate the direction of the storm. Like U.S. Pat. No. 4,023,408 it discloses the use of crossed magnetic field sensors and an electric field sensor. Discrimination of lightning signals over background and interfering signals is provided by filtering the output of the antenna elements at one kilohertz. The square root of the outputs of the magnetic field sensors are compared with the absolute value of the electric field element to produce a number which is related to the ratio of the magnetic to electric fields. This ratio is related to range according to FIG. 8 of the subject application. The inventor, Ruhnke, first described this curve in a NOAA Technical Report ERL 195-APCL 16.

As disclosed in the Ruhnke patent, range is calculated based on the H/E ratio curve of FIG. 8 of the subject application. However, the curve shows that ambiguities in range occur for some H/E values since H/E decreases after peaking at about 50 Km. No mention is made of how to resolve the ambiguity. Similarly, the sole discriminate for background noise relies on a one kilohertz filter. The full information contained in the details characterizing lightning strokes are not utilized.

Within a few years of Doctor Ruhnke's effort, Doctor E. Krider and associates built a magnitude direction finder utilizing the initial few microseconds of a lightning stroke which provided accurate directions to the channel basis lightning discharges. Tests on a number of storms at distances of ten to one hundred kilometers indicated angular resolution in the range of one to two degrees. Another important observation by Dr. Krider was that the first few microseconds of a wide band mangetic waveform are due to the radiation field term and the general field equation and that the lightning channel near the ground tends to be straight and vertical which minimizes polarization errors. Dr. Krider's instrument did not actively address ranging.

SUMMARY OF THE INVENTION

The present invention comprises an apparatus and method for displaying the location of regions of recently occurring lightning activity. The invention comprises a receiving means for separately receiving the electric (E) and magnetic (H) field components of lightning signals over a wide range of frequencies. In the preferred embodiment, the receiving means includes a pair of cross-loop sensors and an electric field sensor. These sensors measure the time rate of change of the magnetic and electric flux densities. The outputs are suitably amplified and integrated to provide a measure of the E and H fields of the lightning signals.

Recognition circuitry means connected to the receiving means recognizes lightning signals received by the receiving means and discriminates against interfering signals and background noise. The recognition circuitry means, in the preferred embodiment, comprises rise time circuitry means and threshold circuitry means which responds to the rise time of the electric field signals and the amplitude of the magnetic field components respectively. Alternatively, the rise time of the magnetic field components can be utilized. When a positive rise time signal and a positive threshold signal is present at the same time, first gating circuitry is triggered which provides a signal indicating that a bonafide lightning strike has occurred. In the preferred embodiment, only rise times of less than five microseconds will provide a positive signal.

Control circuitry means connected to the recognition circuitry means provides control signals to the apparatus. It provides integration control signals, sampling control signals, and an interrupt signal.

Integration circuitry means connected to the receiving means and to the control circuitry means, separately integrates the total E field and H field received from the receiving means. The integration is performed over a predetermined time interval in response to integration control signals received from the control circuitry means. In the preferred embodiment, when the rise time and threshold of the received lightning signals indicate that a valid lightning stroke is present at the E and H field sensors, switching circuitry is activated in response to the integration control signals to allow the output of the receiving means to be integrated over the predetermined time interval. In the preferred embodiment, this predetermined time interval is one hundred microseconds.

The output of the receiving means is also transmitted to the sampling means which in response to sampling control signals from the control circuitry means samples the E and H field values of the receiving means. These samples are provided each time the electric field value peaks after a rise time which is less than the predetermined rise time, in this case five microseconds. These fast rise time signals are held at the peak value by track and hold circuitry and then converted by A to D converters and stored in a first-in first-out (FIFO) memory.

When the predetermined integration interval is over, that is, when the lightning stroke activity ends, an interrupt signal from the control circuitry means is transmitted to a programmable processing means which in turn reads the contents of the FIFO memory into its own read only memory (ROM). At the same time, the processing circuitry means also reads the integrated E and H field values for the predetermined interval through a multiplexer circuit and one of the FIFO memories. The sampled E and H field values read from the FIFO's are related by the following equation:

$$-H_x \sin(\phi) + H_y \cos(\phi) = E_z/(Z_0 \sin(\theta))$$

where $\phi$ is the azimuth angle to the lightning stroke and $\theta$ is the elevation angle. Two sample sets of the E and H field values entered in the above equation results in the simultaneous solution of two equations to solve for $\theta$ and $\phi$. Because in general each lightning stroke produces a plurality of sampled E and H field values, at least one set of values for $\theta$ and $\phi$ can be solved for by the processing circuitry means.

The total magnetic field value is calculated from the sampled magnetic fields and the value compared with a predetermined field strengths to estimate which of several range regions the lightning stroke occurred in, that is, in the near, mid, or distant range region. Similarly, the integrated H field value is also compared to predetermined field strengths to predict which range region the lightning stroke occurred in. If the regions predicted by the two methods are adjacent regions or the same region then the ratio of the integrated H/E field values are used to determine the range from a look-up table.

If the two regions predicted are the near and distant regions then the ratio of the total H to the total E field value is calculated from the sample data and used to determine the range from the look-up tables.

A standard deviation value for the set of elevation and azimuth angles calculated from the sampled field values is calculated. The standard deviation value and the range value to a lightning stroke (expressed in rectangular coordinates) is transmitted to a programmable display means. The display means then displays the lightning stroke activity as a region of activity on a display, in accordance with its own programming.

When the apparatus of the present invention is installed in an aircraft, means for adjusting and updating the measurement of lightning stroke location for aircraft movement (speed and heading) is provided.

The objects, features and advantages of the present invention will become more fully apparent from the following detailed description of the preferred embodiment, the appended claims and the accompanying drawings in which:

Figure 4:
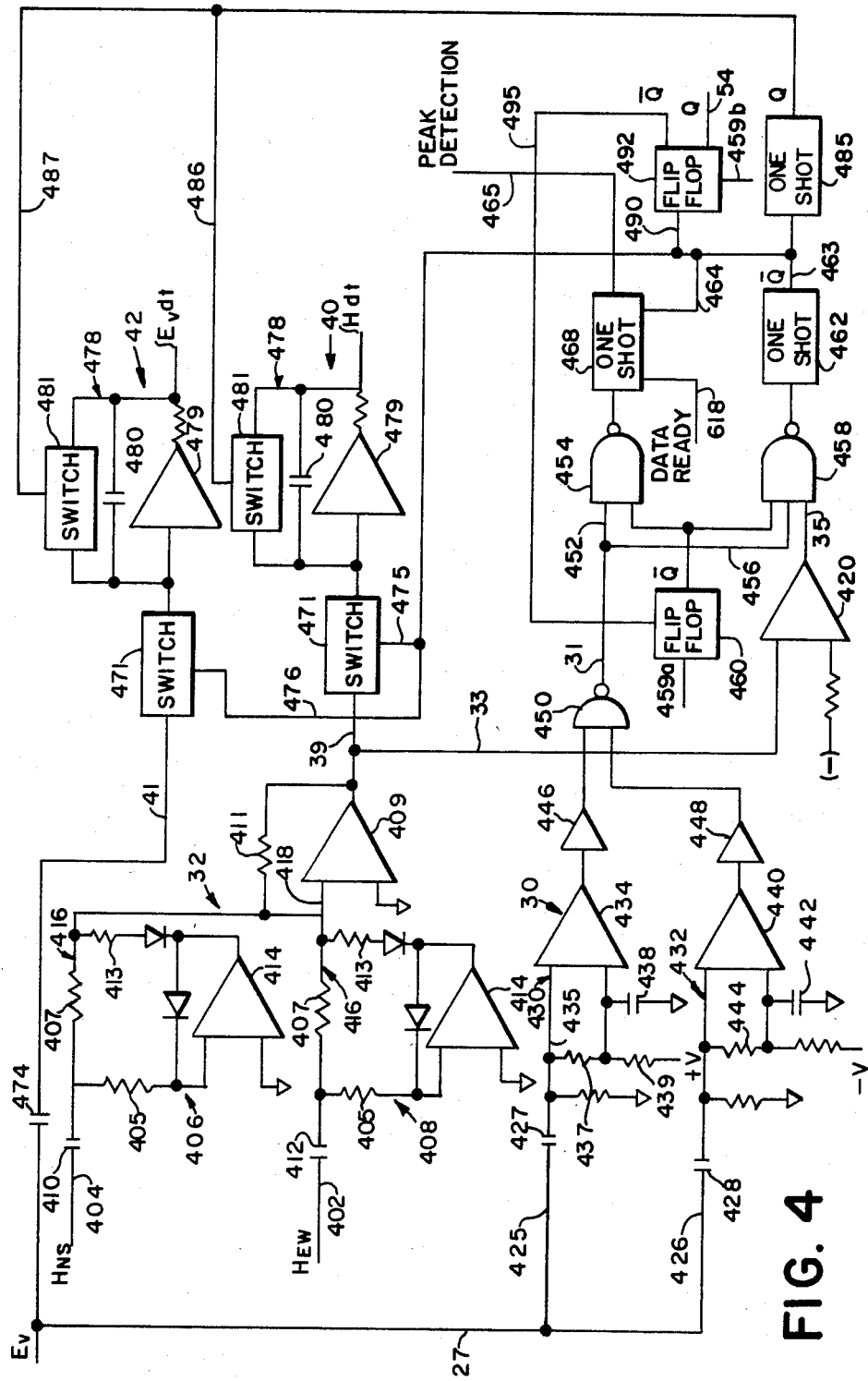
FIG. 4 is a more detailed block diagram of a third portion of FIG. 1.
Figure 5:
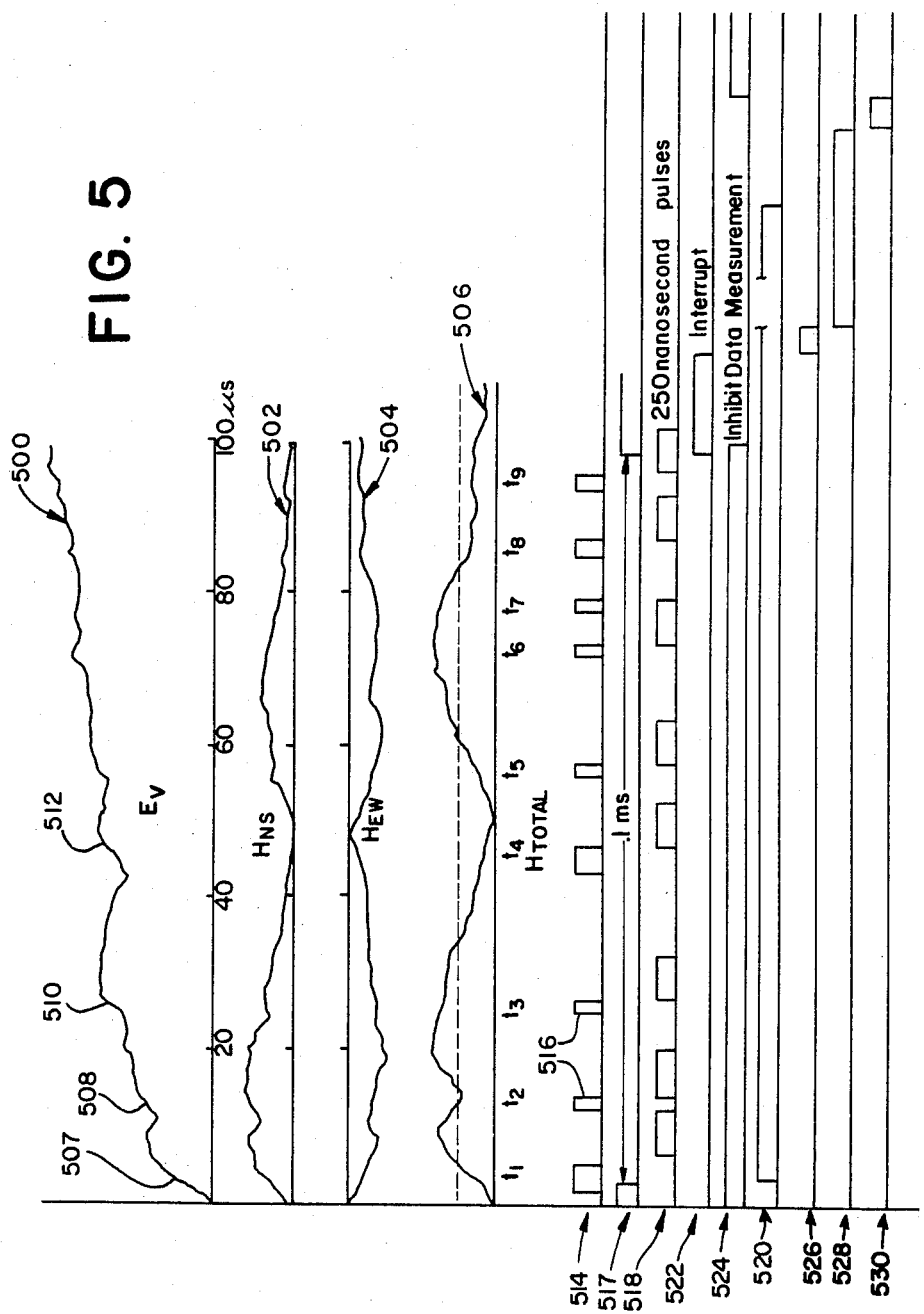

FIG. 5 in part shows a representation of the signals of a lightning stroke, and in part is a timing diagram for a portion of FIG. 4.

Figure 1:
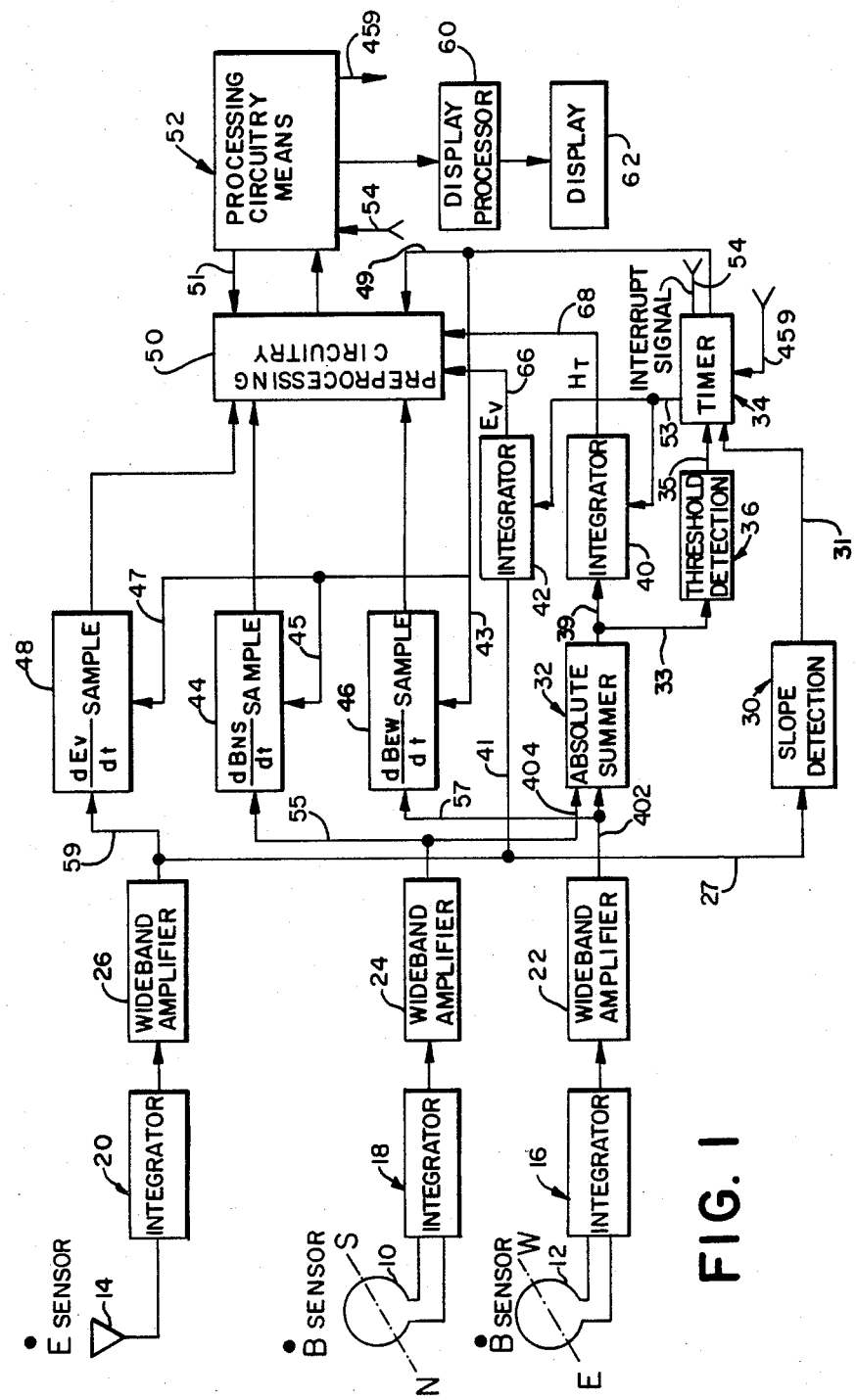
FIG. 1 is a preferred embodiment block diagram schematic of the present invention.
Figure 6:
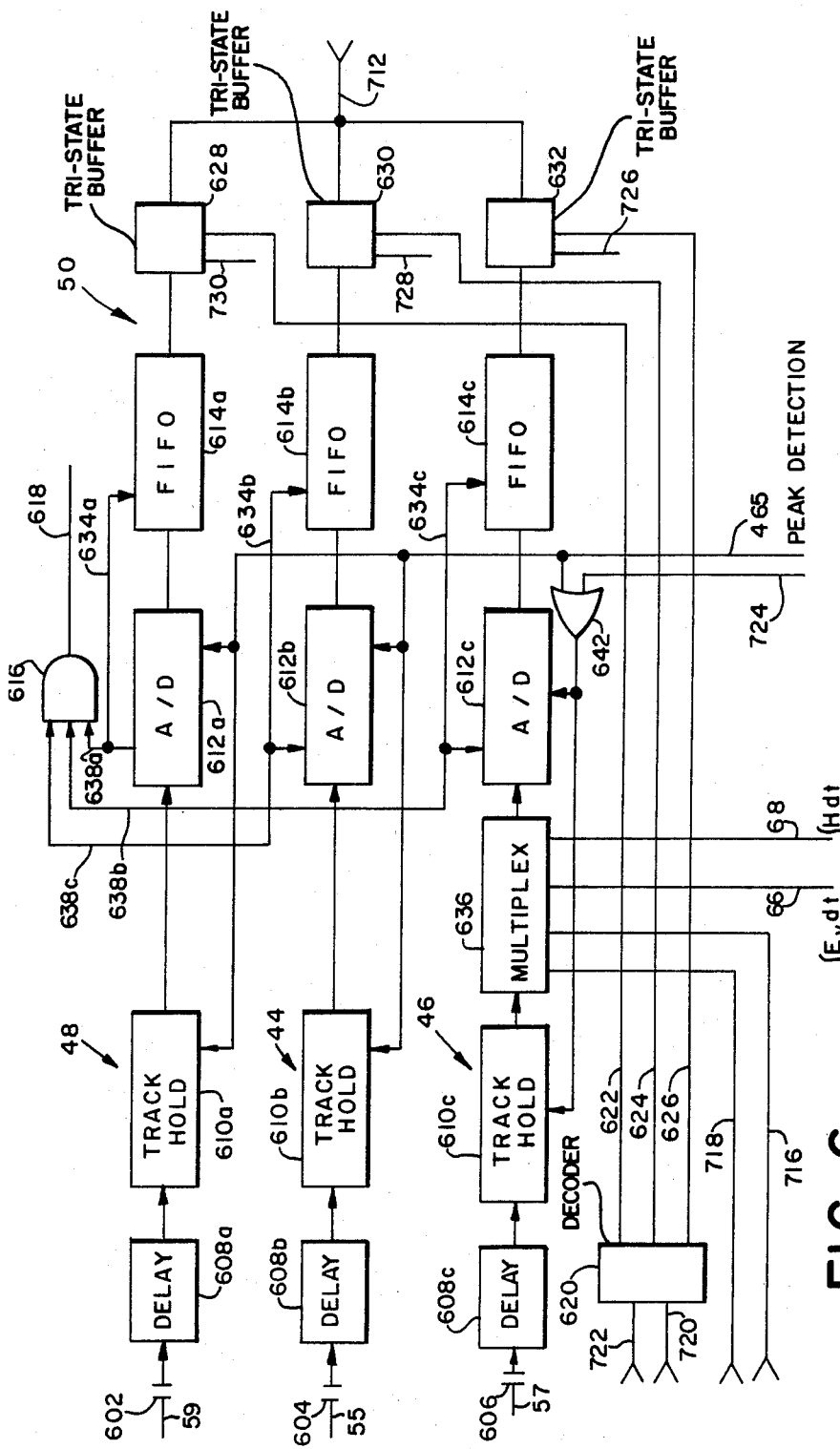

FIG. 6 is a more detailed block diagram of a fourth portion of FIG. 1.

Figure 7:
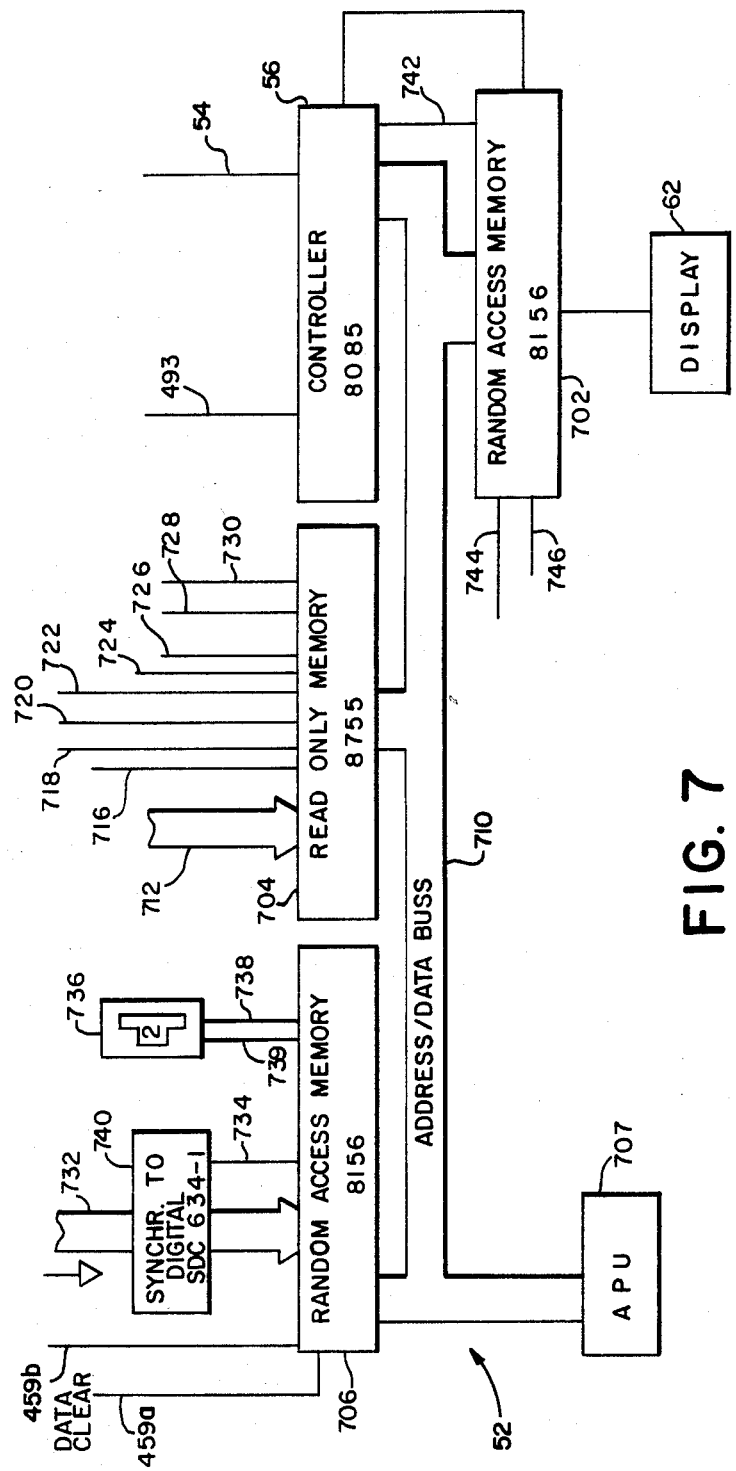

FIG. 7 is a more detailed block diagram of a fifth portion of FIG. 1.

Figure 8:
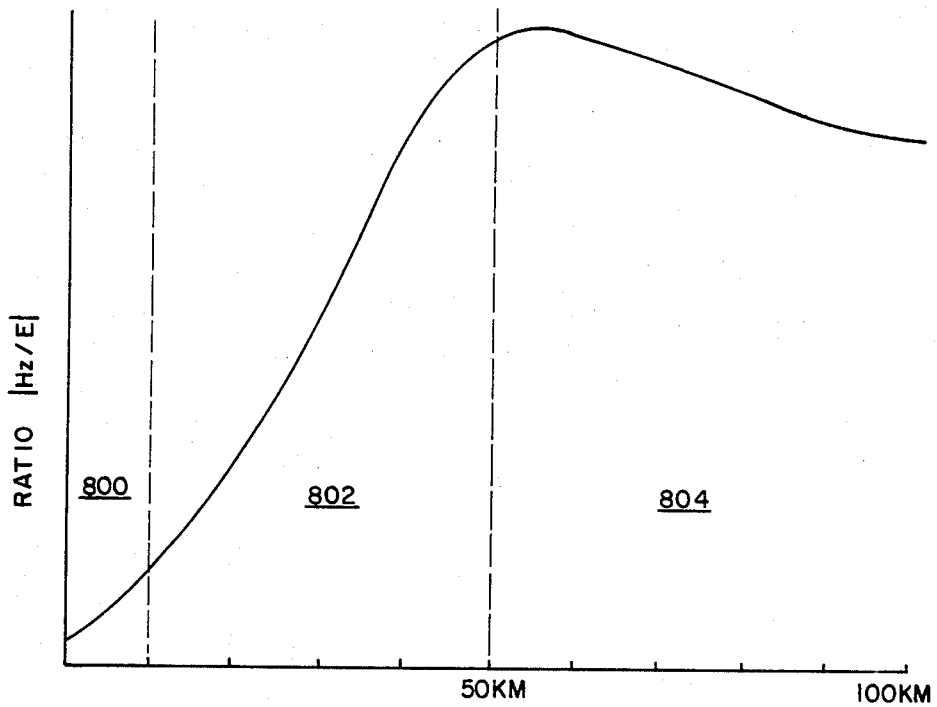

FIG. 8 is a graph showing the relationship between the absolute value of the ration of the magnetic field radiated from a lightning stroke to the electric field so radiated versus range to the lightning stroke.

Figure 9B:
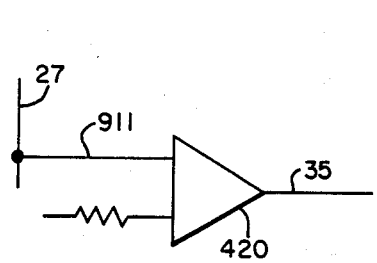
Figure 9C:
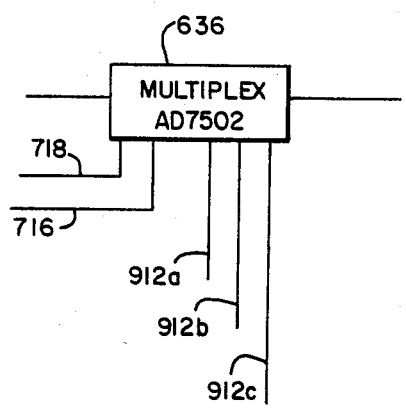
Figure 9A:
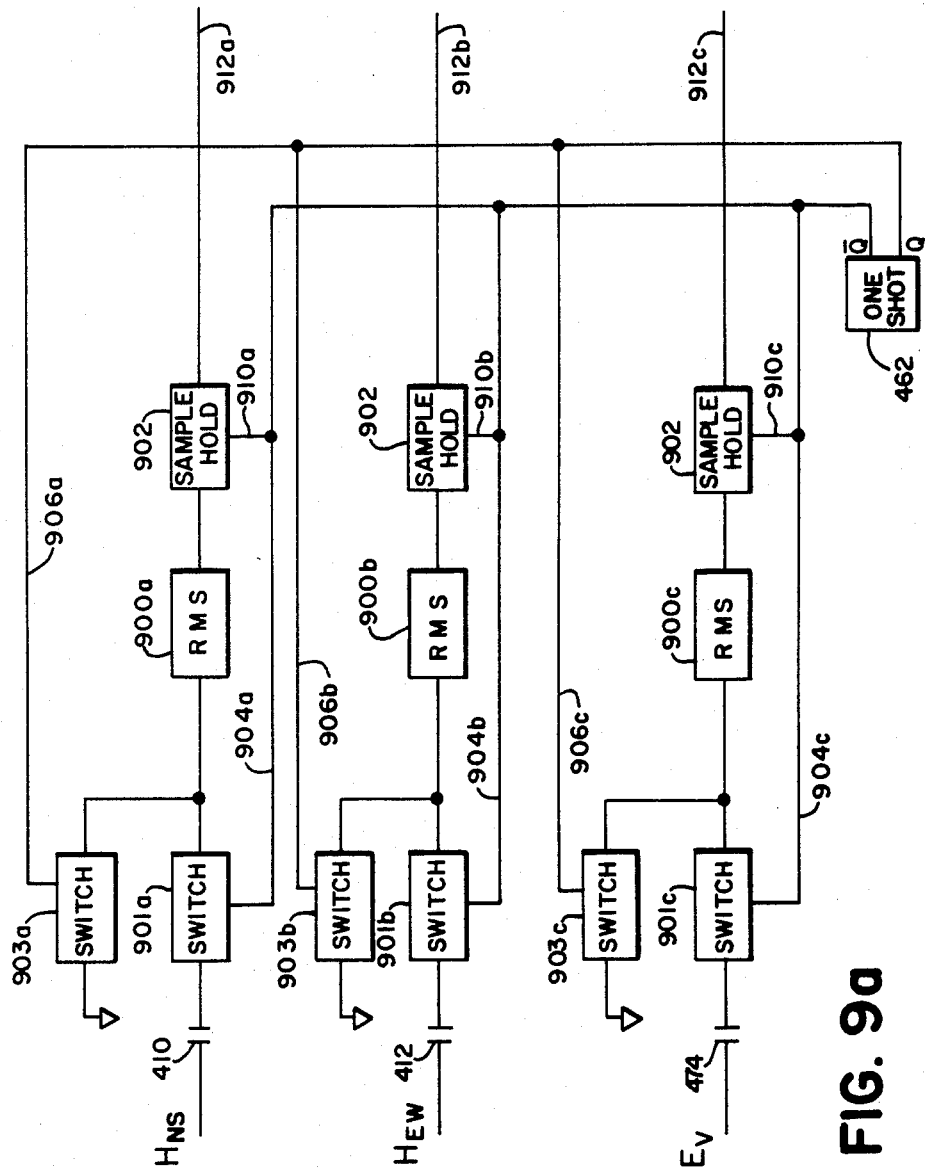

FIGS. 9a-c are an alternate block diagram embodiment of portions of FIG. 4.

DETAILED DESCRIPTION OF THE DRAWINGS

FIG. 1 is a block diagram of the preferred embodiment of the present invention. The apparatus comprises a pair of cross loop magnetic field antennas 10 and 12 and an electric field antenna 14. Since the cross loop magnetic field antenna elements have their axes perpendicular to one another, antenna 10 will be referred to as the north/south magnetic field antenna while antenna element 12 is the east/west magnetic field antenna. The three antenna elements are responsive to the time rate of change of magnetic and electric flux densities occurring because of electrical activity associated with lightning strikes. The signals received by the antenna elements are transmitted to integrators designated generally 16, 18 and 20 which provide an east/west magnetic field component, a north/south magnetic field component and a vertical electric field component respectively to wide band amplifiers 22, 24 and 26. In the preferred embodiment, the antenna elements, the integrators and the wide band amplifiers operate over the frequency range of one kilohertz (KHz) to fifteen megahertz (MHz) but other bandwidths larger or smaller could be used.

The outputs of the wide band amplifiers 22 through 26 are provided in parallel to a sampling portion of the circuitry of the apparatus and to the recognition circuitry portion of the apparatus. The recognition circuitry portion of the apparatus comprises slope detection circuitry designated generally 30, absolute summer circuitry designated generally 32 and threshold detection circuitry designated generally 36. The output of wide band amplifier 26 containing the vertical electric field signal is transmitted via line 27 to slope detection circuitry 30. If the rise time of this signal is less than a predetermined rise time a positive signal is transmitted to timer circuitry designated generally 34 via line 31. Similarly, the magnetic field signals transmitted from wide band amplifiers 22 and 24 respectively are summed vectorially in the absolute summer circuitry 32. The output of this circuitry represents the magnitude of the total magnetic field present at the antenna elements 10 and 12. This signal is transmitted via line 33 to threshold detection circuitry 36 which provides a positive signal to timer circuitry 34 via line 35 if the signal exceeds a predetermined threshold level. The output of the absolute summer circuitry is also transmitted via line 39 to integrator circuitry 40 while the electric field signal from wide band amplifier 26 is also transmitted via line 41 to integrator 42.

If the voltage level of the magnetic field signal from circuitry 32 exceeds the predetermined threshold level of circuitry 36 and if the rise tiem of the vertical electric field signal from wideband amplifier 26 is less than the predetermined rise time of slope detection circuitry 30 then the timer circuitry 34 is caused to provide integration control signals via line 53 to the integrators 40 and 42. Integrators 40 and 42 then integrate the magnetic and electric field signals over a predetermined time interval which corresponds to the most likely period over which the lightning stroke exists. The slope detection circuitry 30, the absolute summer circuitry 32, and the threshold detection circuitry 36, provide a means for recognizing the magnetic and electric field signals associated with the lightning strike in the presence of interfering and background noise signals.

The north/south and east/west magnetic field signals are also transmitted over lines 55 and 57 to sampling circuitry 44 and 46 respectively. The vertical electric field signal from wide band amplifier 26 is transmitted via line 59 to sampling circuitry 48. Samples of the magnetic field and electric field signals representing the peak of each change in the fields are taken in response to peak detection signals provided from timer circuitry 34 over lines 43, 45 and 47. Peak detection signals are generated by timer circuitry 34 in response to positive output signals from the slope detection circuitry 30.

The samples of the magnetic and electric field signals are converted to digital signals by A/D converters in response to the peak detection signals. The digital signals are stored in first-in first-out (FIFO) memories. Similarly, the integrated electric field and magnetic field signals from integrators 40 and 42 pass through A/D converters and are stored IN FIFO memory. Together the A/D converters and FIFO memories are shown as preprocessing circuitry 50 in FIG. 1. The peak detection signal for the A/D converters are transmitted thereto via line 49.

The apparatus further comprises processing circuitry means designated generally 52. When the predetermined integration interval corresponding to the existence of the lightning stroke is ended the timer circuitry 34 transmits an interrupt control signal via line 54 to the processing circuitry means which in response thereto commands the first-in first-out memories of preprocessing circuitry 50 over multiple lines 51 to transmit the samples of the magnetic and electric field values and the integrated magnetic and electric field values to a memory in processing circuitry means 52. This information is utilized in accordance with the programming of the processing circuitry means to calculate the region of activity of the lightning stroke. The results are transmitted to a display means which then displays the results on a display. The display means comprises a display processor 60 and display 62. In the preferred embodiment, the processing circuitry means 52 is enabled to compensate for movement of a host platform (such as an aircraft) when determining the region of lightning activity.

Figure 2:
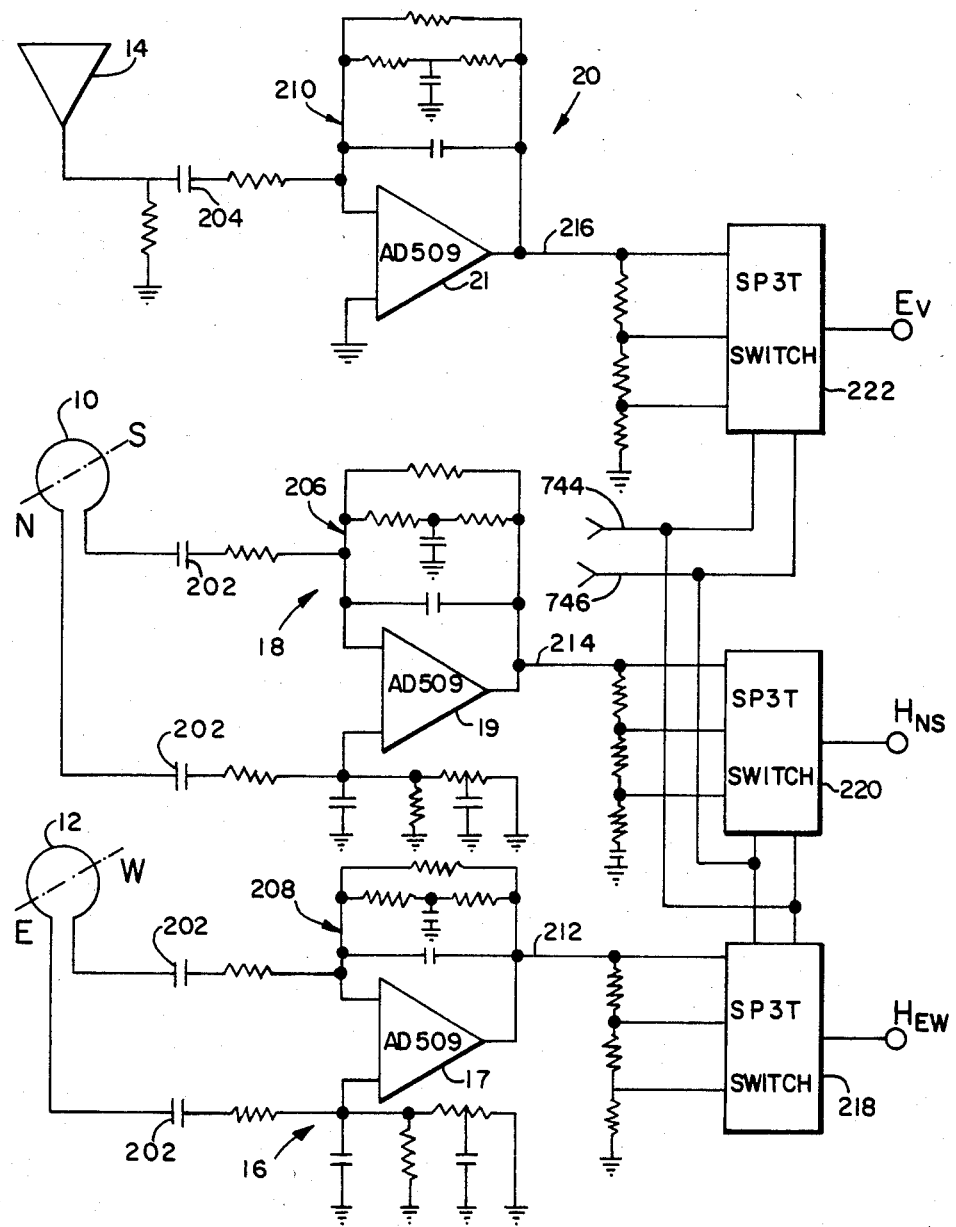
FIG. 2 is a more detailed block diagram of a first portion of FIG. 1.

Referring now to FIG. 2, further details of the integrators 16 through 20 are provided. In the preferred embodiment, the north/south magnetic field antenna 10 and the east/west magnetic field antenna 12 are commercially available antennas from EG&G Company, Models Nos. CML-7 (R). The electric field antenna element 14 is an EGG Model No. FPD-2 B(R). The antenna elements 10 through 14 are AC coupled through capacitors 202 for the magnetic field elements and capacitor 204 for the electric field antenna 14. The integrators 16 through 20 comprise amplifiers 17, 19 and 21 (Analog Device Model No. AD509) in parallel with filter circuitry designated generally 206 and 208 for magnetic field antennas 10 and 12 respectively and designated generally 210 for electric field antenna element 14. The filter circuitry filters out unwanted high frequency components detected by the antenna elements and outside the frequency band of interest. Further details on the design of magnetic antenna sensors and wide band integrators suitable for the present invention can be found in a paper by E. Philip Krider and R. Karl Noggle entitled "Broad Band Antenna Systems for Lightning Magnetic Fields", Journal of Applied Meteorology, Vol. 14, March 1975 hereby incorporated by reference as if specifically set forth herein. A similar circuit is reported by Fisher and Uman, in "Measured Electric Field Rise Times for First and Subsequent Lightning Return Strokes", Journal of Geophysical Research, Vol. 77, Jan. 1972 which is hereby incorporated by reference as if specifically set forth herein. Selection of impedance matching devices are described in these two references and further information may be found in numerous articles on lightning measurement techniques. The outputs from the integrators 16 through 20 are then transmitted over lines 212, 214 and 216 respectively to single pole three throw switches 218, 220 and 222 (Analog Device Model Nos. AD7502). The output of the switches provide the weak unamplified north/south and east/west magnetic field components and the vertical electric field cmponents. The functioning of the switches will be described later in connection with the processing circuitry means.

Figure 3:
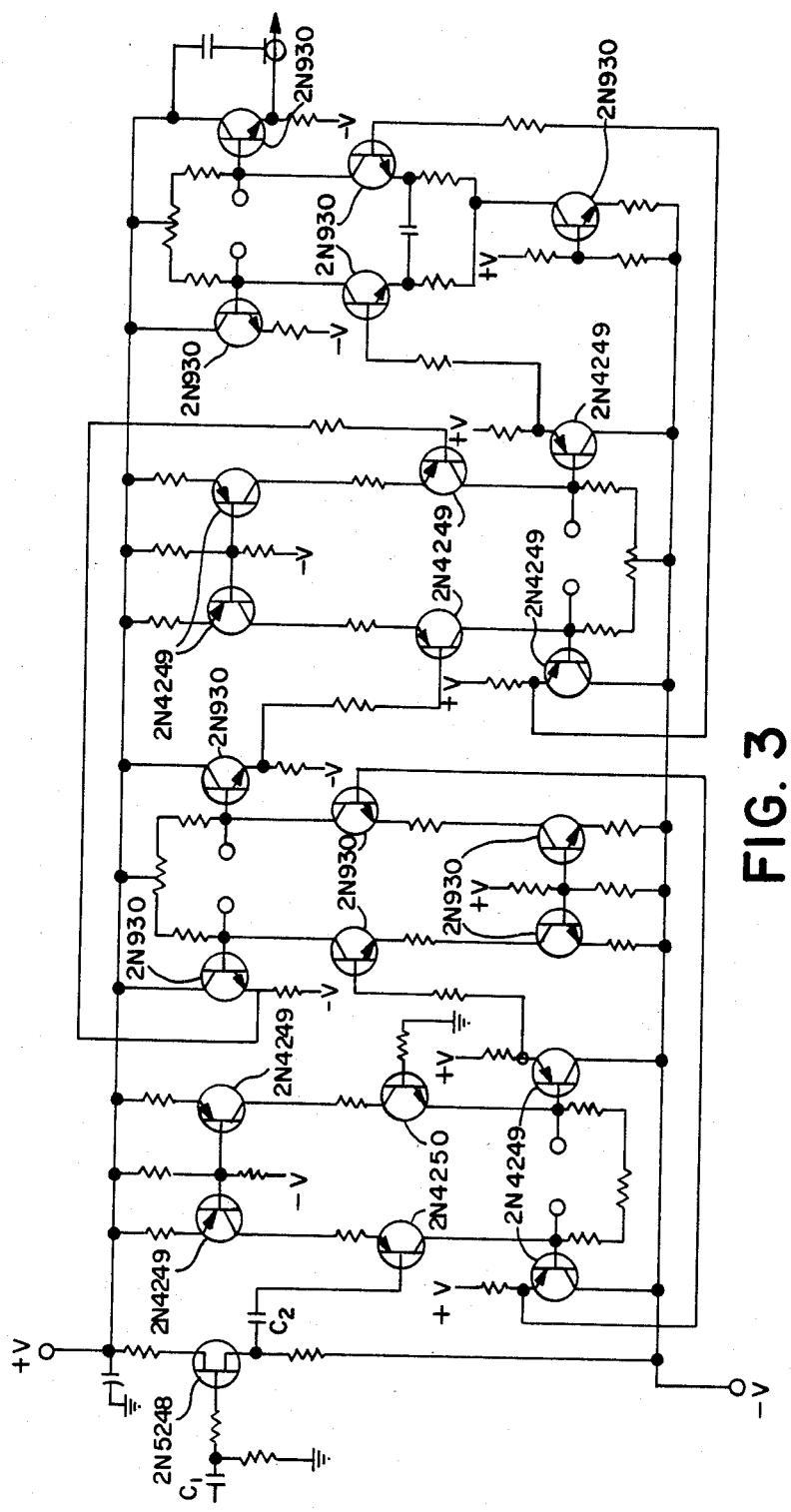
FIG. 3 is a detailed schematic of a second portion of FIG. 1.

FIG. 3 shows in some detail a transistorized wide band amplifier 300 of conventional design. It comprises at least four amplifier stages which are directly coupled. The wide band amplifier operates over a frequency range from one KHz to 15 MHz and has a maximum gain of approximately six thousand. The selection of the parameters of the wide band amplifier depends on the type of sensors used, the electric environment and subsequent processing circuitry. The wide band amplifier shown in detail in FIG. 3 is suitable for use as amplifiers 22, 24 and 26 in FIG. 1. Alternatively, wide band amplifiers 22, 24 and 26 can be provided using Motorola wide band amplifiers (Model No. MWA 110,-120,-130) in a cascaded circuit design. See Motorola RF Data Manual, 1980 edition, pages 16-33 through 16-40 hereby incorporated by reference as if specifically set forth herein.

Before describing FIG. 4 which shows the absolute summer circuitry 32, the slope detection circuitry 30, the level detection circuitry 36, timer circuitry 34 and integrators 40 and 42 in detail, it is instructive to discuss the shape of the expected field voltage pulses received from the wide band amplifiers 22, 24 and 26. In FIG. 5 a series of even numbered curved designated generally 500-506 are shown representing the vertical electric field $E_V$ from wide band amplifier 26, the $H_{NS}$ field voltage from wide band amplifier 24, the $H_{EW}$ field value from wide band amplifier 22 and the absolute magnitude of the combined magnetic field, respectively H. The ordinate in each curve represents voltage amplitude in millivolts while the abscissa represents time in microseconds. Inspection of the curves show that the H and E field voltages associated with a single lightning stroke (many strokes comprise a lightning flash) usually last about one hundred microseconds. Much research in the nature of electrical signals arising from lightning strokes indicates that almost all vertical electric field voltages ($E_V$) will have an initial rise time (see 507 on curve 500) of less than five microseconds, and that the pulse will contain a plurality of randomly placed smaller pulses or peaks of submicrosecond duration and rise times of less than five microseconds. See for example positive slopes 508, 510, 512 etc. on curve 500 in FIG. 5. The recognition circuitry of FIG. 4 takes advantage of these characteristics to cooperate with the control circuitry portion of FIG. 4 to furnish control signals for integrating and sampling the E and H field voltages.

Referring now to FIGS. 1 and 4, the absolute summer circuitry designated generally 32 connected to the $H_{EW}$ and $H_{NS}$ wide band amplifiers 22 and 24 on lines 402 and 404 respectively comprises a pair of first circuitry portions designated generally 406 and 408 and an output operational amplifier 409. Capacitors 410 and 412 block unwanted DC components from the first circuitry portions 406 and 408 but pass the pulsed magnetic field voltages $H_{NS}$ and $H_{EW}$.

First circuitry portion 406 (which is identical to circuitry portion 408) comprises an operational amplifier 414 and switching circuitry designated generally 416. If the $H_{NS}$ field voltage is negative then operational amplifier 414 switches resistors 405 and 413 into the circuit at the output of 409. This has the effect of inverting the $H_{NS}$ voltage. If $H_{NS}$ is positive the switching circuitry 416 by-passes the resistors 405 and 413 and the output is through resistor 407. In this manner only the absolute magnitudes of the $H_{NS}$ and $H_{EW}$ field voltages are delivered to operational amplifier 409 over single input line 418.

The combined magnetic field voltage from operational amplifier 409 is then transmitted to operational amplifier 420 via the line 33 (see also FIG. 1). Operational amplifier 420 is biased to a predetermined negative threshold voltage. Unless the combined magnetic field voltage exceeds the magnitude of the threshold voltage, operational amplifier 420 provides a low output. The biased operational amplifier 420 provides the threshold detection function of threshold detection circuitry 36. Curve 506 in FIG. 5 represents the total magnetic field signal transmitted from operational amplifier 409.

The vertical electric field voltage $E_V$ is transmitted from wide band amplifier 26 via line 27 (see FIG. 1) and then lines 425 and 426 through DC blocking capacitors 427 and 428 to the slope detection circuitry designated generally 30. Slope detection circuitry 30 comprises two parallel similar circuits designated generally 430 and 432. Circuitry 430 comprises operational amplifier 434 (Analog Device Model No. AD 509) with two inputs 435 and 436. Input 435 is connected to input 436 via resistor 437 and input 436 is connected to ground through capacitor 438. Operational amplifier 434 will provide a positive output voltage to inverter 446 whenever the field voltage $E_V$ increases faster than capacitor 438 can charge through resistor 437. The product of resistor 437 and capacitor 438 determines the sensitivity of the slope detection circuitry. For the preferred embodiment, this product is set of 62 microvolts per second and thus allows only the submicrosecond lightning pulses to be detected. Input 436 has a positive voltage bias through resistor 439 and the ratio of resistors 437 and 439 sets the minimum signal level which the slope detection circuit will detect. The preferred embodiment is set as 2 millivolts.

Similarly, circuitry 432 comprises operational amplifier 440 (Analog Device Model No. AD509) and it will provide a positive output to inverter 448 whenever field voltage $E_V$ decreases faster than capacitor 442 can charge through resistor 444. Either a positive or negative voltage change of $E_V$ having the correct rise time as functionally defined by circuitry 430 and 432 will provide a positive input to inverter 446 or 448. If no fast rise time occurs, the outputs of operational amplifiers 434 and 440 will be low triggering a high output from inverters 446 and 448. Examples of submicrosecond pulses which will trigger the above described circuitry is shown as slopes 507, 508, 510 and 512 in FIG. 5.

The outputs of inverters 446 and 448 are furnished as inputs to NAND gate 450. In the absence of any fast rise time pulses from wind band amplifier 26, the outputs of the inverters are high and NAND gate 450 output is low. When a slope of the proper rise time (either positive or negative) occurs on the $E_V$ voltage pulse 500 one of inverters 446 or 448 will go low causing the output of NAND gate 450 to go high until the peak voltage on the pulse on curve 500 is reached and then the output of NAND gate 450 will go low. See FIG. 5, curve 514, where the output of NAND gate 450 is shown as a series of pulses 516 corresponding to fast rise time on the $E_v$ signal 500.

The output of NAND gate 450 is transmitted via line 452 to NAND gate 454 and line 456 to NAND gate 458. A flip flop 460 is provided and its $\overline{Q}$ output is transmitted to NAND gates 454 and 458 as a high gating signal. NAND gate 458 also receives the output of operational amplifier 420 from threshold detection circuitry 32 via line 35 as a third input.

When the processing circuitry means 52, (see FIG. 1) clears flip flop 460 with a data clear signal via line 459a (after it has finished taking data from preprocessing circuitry 50) a high signal is transmitted from 460 $\overline{Q}$ to NAND gates 454 and 458 enabling them. When a low signal is transmitted to NAND gate 450 (indicating a fast rise time) it transmits a high to NAND gate 454 and 458. If at the same time, threshold detection operational amplifier 420 transmits a high to NAND gate 458, NAND gate 458 will transmit a low signal to one shot 462 which upon receiving the low signal will generate or transmit a one hundred microsecond long low signal at its $\overline{Q}$ output 463. See signal 517 of FIG. 5 for the 100 microsecond low signal. This low signal is transmitted via line 464 to a low enable input of one shot 468.

Whenever slope detection circuitry 30 provides a low signal input to NAND gate 450 in response to a fast rise time pulse on signal 500, NAND gate 450 transmits a high signal to NAND 454. If the $\overline{Q}$ output from flip flop 460 is also high then NAND gate 454 will transmit a low signal to one shot 468 as long as the output from gate 454 remains high. (This output remains high until the fast rise time pulse from wideband amplifier 26 peaks and then in returns low.) As the signal from NAND gate 450 returns low, the output of NAND gate 454 will go high and this will trigger one shot 468 (as long as the low enable input is low) to generate a 250 nanosecond pulse on line 465 on the leading edge of the high signal from NAND gate 454. This 250 nanosecond high signal is one of the control signals generated by timer circuitry 34 and is called the peak detection signal. Peak detection signals occur even when a positive threshold signal from operational amplifier 420 is absent as long as one shot 468 is enabled by the one hundred microsecond pulse from 462$\overline{Q}$. The peak detection signals are shown on curve 518 of FIG. 5. Note that they occur on the falling edge of the NAND gate 450 high signal which is the same as the leading edge of the high going signal from NAND gate 454.

The total magnetic field from absolute summer circuitry 32 is also transmitted via line 39 (see FIG. 1) to integrator 40 which comprises an input switch 471 and integrator circuitry designated generally 478 in parallel with a second switch 481. Integrator circuitry 478 comprises an operational amplifier 479 in parallel with a capacitor 480. The output of switch 471 is connected to the input of the parallel arrangement of integrator circuitry 47 and second switch 481. The vertical E field component from wideband amplifier 26 is also transmitted through DC blocking capacitor 474 over line 41 to an integrator 42 which is identical in design to the integrator 40. Input switches 471 are normally open but they are switched to closed by the one hundred microsecond low signal from one shot 462 $\overline{Q}$ along lines 475 and 476. When the switches are closed, the $E_V$ and H field voltages are transmitted to integrator circuitry 478.

The second switch 481 in each circuit is normally closed and provides an alternate path to the integration circuitry 478. However, the low one hundred microsecond pulse 517 from one shot 462 is also connected to one shot 485. Upon receiving it, one shot 485 on the falling edge of the low signal 517 generates and transmits a high two hundred microsecond pulse (see diagram 520 of FIG. 5) over lines 486 and 487 to switches 481 to open them.

When input switches 471 are open, closed second switches 481 provide a means for keeping integrator circuitry 478 from saturating on input noise. Switches 481 open when switches 471 close but switches 481 remain open for 100 microseconds after switches 471 open to allow the H and $E_V$ integrated signals to be transmitted to preprocessing circuitry 50 in FIG. 1. The one hundred microsecond 462 $\overline{Q}$ signal to switches 471 and 485 Q signal to switches 481 are control signals controlling the integration of the E and H field voltages over the one hundred microsecond interval.

Finally, the $\overline{Q}$ output of one shot 462 is connected via line 490 to flip flop 492. When the one hundred microsecond interval is over and 462 $\overline{Q}$ goes high it sets flip flop 492 causing a high signal to be transmitted via line 54 to the processing circuitry means 52 as an interrupt signal (see diagram 522 in FIG. 5). At the same time, flip flop 492 $\overline{Q}$ goes low and is transmitted via line 495 as an inhibit data measurement signal to flip flop 460 setting it and causing 460 $\overline{Q}$ to go low. The low signal disables NAND gates 454 and 458 while the processor circuitry means 52 interrogates preprocessing circuitry 50 for the sampled and integrated E and H field voltages (see diagram 524 in FIG. 5 for the inhibit data measurement signal). When the processing circuitry means 52 has finished interrogating the preprocessing circuitry 50, it transmits a clear signal to flip flops 460 via line 459a (see diagram 530 in FIG. 5) and 492 via line 459b (see diagram 526 in FIG. 5) which results in enabling gates 454 and 458 and disabling the high interrupt signal 54 to the processing circuitry means 52 from flip flop 492.

All of the operational amplifiers shown in FIG. 4 are Analog Device Model No. AD509 amplifiers. Switches 471 and 481 are Analog Device Model No. AD7513 switches. The remaining logic and circuit components are easily recognized and commercially available components.

FIG. 6 shows the electric ($E_V$) and magnetic ($H_{NS}$ and $H_{EW}$) field sampling circuitry designated generally 44, 46 and 48 and preprocessing circuitry 50 of FIG. 1 in more detail. Capacitors 602, 604 and 606 block unwanted DC components from the signals $E_V$, $H_{NS}$ and $H_{EW}$ respectively furnished over lines 59, 55 and 57 but pass the pulsed field voltages. The field voltages are then transmitted through delay circuitry 608a, b and c (Harry J. White Co. Model No. MD600201K) before being forwarded to track and hold circuitry 610a, b and c. The track and hold circuitry (Model No. HTC-0300 MM, made by Analog Devices) in response to the peak detection control signals from one shot 468 over line 465 holds the peak field voltage constant. The voltage held by track and hold circuitry 610a, b and c is the peak voltage occurring after a five microsecond or less rise time in the $E_V$ voltage 500. (see the slopes 507, 508, 510 and 512). There is some delay of the peak voltage as it passes through the circuitry of FIG. 4 before a peak voltage detection control signal is generated. To accommodate this delay, delay circuitry 608a, b and c is added. In the preferred embodiment, about six hundred nanoseconds of delay is required.

Each peak field voltage signal held by track and hold circuitry 610a, b and c is converted to a digital signal by A to D (A/D) converters 612a, b and c in response to the falling edge of the peak detection signal from line 465 and causes a low signal on lines 634a,b and c and 638a,b and c. In the preferred embodiment, the A/D converters 612a,b and c are Datel-Intersil devices, Model No. ADC817MM, which converts the signal into a twelve bit digital signal in 2.5 microseconds when the conversion is complete. A/D converters 612a,b and c then transmits a high signal over lines 634a,b and c which causes the digital sampled peak field voltage to be clocked into the first-in first-out (FIFO) memories 614a,b and c where they are stored until called for by the processing circuitry means 52. As described earlier, each peak signal on waveform 500 ($E_V$) in FIG. 5 which has a rise time less than equal to five microseconds causes a peak detection signal which then causes a sample of the $E_V$, $H_{NS}$ and $H_{FW}$ field signals to be taken and stored in FIFOs 614a,b and c during the one hundred microsecond interval (signal 517 in FIG. 5) generated by one shot 462 $\overline{Q}$ in FIG. 4. In the preferred embodiment, FIFOs 614a,b and c are Advanced Micro Devices, Model No. AM 2812A.

When the A/D converters generate rising edge signals over lines 634a,b and c and transmit the twelve bit digital signals to FIFO memories 614a,b and c, they also transmit high data ready signals to AND gate 616 over lines 638a,b and c. AND gate 618 transmits a high data ready signal over line 618 to one shot 468. This enables one shot 468 to generate a new peak detection signal. If the data ready signal were not used to enable 468 a second closely occurring peak voltage signal on waveform $E_V$ would generate a second peak detection signal causing the A/D conversion process of the first sample signal to be interrupted.

An alternate embodiment for implementing the integration of the total H and E field voltages requires modifications to FIG. 4 and is described in block diagram form in FIGS. 9a,b and c. A true RMS measurement of the $H_{EW}$, $H_{NS}$ and $E_V$ field voltages are made accurately by a commercially available device Analog Devices Model No. AD536. The preferred embodiment implements the auxiliary dB output of the AD536A as described in the Analog Devices Data Acquisition Products Catalog, 1978 edition, pages 229-234 hereby incorporated by reference as if specifically set forth herein. Input to the RMS converters 900a,b and c are from switches 901a,b and c which are identical to the switches 471 described in FIG. 4. One shot 462$\overline{Q}$ in FIG. 4 transmits a low 100 microsecond pulse to switches 901a,b and c over lines 904a,b and c closing them and allowing RMS converters 900a,b and c to integrate the $H_{EW}$, $H_{NS}$ and $E_V$ field voltages. At the same time high signal 462$\overline{Q}$ opens switches 903a,b and c via lines 906a,b and c. Openings switches 903a,b and c sets the RMS converters 900a,b and c to a known voltage level (ground for preferred embodiment) before starting the 100 microsecond integration. The outputs of RMS converters 900a,b and c connect to Sample and Hold (S/H) circuitries 902a,b and c. The 100 microsecond low signal from 462$\overline{Q}$ is also connected to S/H circuitries 902a,b and c via lines 900a,b and c. On the rising edge of the low signal, the (S/H) circuitries 902a,b and c hold the integrated voltages while the processing circuitry means converters and stores them as digital data. The S/H circuitries 902a,b and c for the preferred embodiment are Harris Corporation Model No. HA-2420-8 devices.

With the alternate embodiments of FIG. 9a, the total H field is not available as an analog voltage. The threshold detection signal for amplifier 420 is provided by connecting the $E_V$ field voltage thereto via line 911 which is connected to line 27. See FIG. 9b. Finally, in FIG. 9c, output lines 912a, b and c from S/H circuitries 902a, b and c are provided to the multiplexer circuitry 636 of FIG. 6. The lines 912a,b and c will now represent the dB RMS voltage of the $H_{EW}$, $H_{NS}$ and $E_V$ fields. The multiplexing and A/D conversion of these signals are similar to that described hereinafter for the integrated E and H fields on lines 66 and 68 in connection with the description of FIGS. 6 and 7.

The processing circuitry means 52 is described in block diagram form in FIG. 7. The processing means comprises the controller 56, random access memory 702, read only memory 704, random access memory 706, arithmetic processing unit 707, and an address data bus 710. The various portions of the processing circuitry means 52 are connected together by the address-/data bus 710.

The processing circuitry means is programmable and the programs are stored in ROM 704. After the processing circuitry means has finished processing data and is ready to receive new data from a new lightning strike it transmits a data clear signal (see diagram 530 in FIG. 5) to flip flops 460 and 492 in FIG. 4 over lines 459a and b. Lines 459a and 459b are is shown connected to the random access memory 706. When a lightning strike is recognized by the circuitry of FIG. 4, a one hundred microsecond integration and sampling time is set by the low output of one shot 462$\overline{Q}$ as described earlier. When this one hundred microsecond interval is over the change in state of the output of one shot 462 sets flip flop 492 providing an interrupt signal 522 over line 54 to the controller 56.

The processing circuitry means is now ready to read the data via bus 712 through the read only memory 704. The data to be read are the sampled $E_V$ and $H_{NS}$ and $H_{EW}$ field values stored in the FIFOs 614 and the integrated $E_V$ and magnetic field values transmitted from integrators 40 and 42 (or, alternatively, S/H circuitries 902a, b and c). To accomplish this the processing circuitry means transmits sample data control signals (see diagrams 526, 528 in FIG. 5) over lines 51 (FIG. 1) which comprise even numbered control lines 716 through 724 (FIGS. 6 and 7) from the read only memory 704. Signals 720 and 722 are transmitted to decoder 620 of FIG. 6 which in turn provides interrogation signals over lines 622,624 and 626 to tri-state buffers 628,630 and 632 (Intel Device No. M8212) respectively. The tri-state buffers 628 through 632 are connected to the FIFO 614a, b and c respectively.

Control lines 716 and 718 from read only memory 704 are connected to multiplexer 636 (Analog Device No. AD7502) of FIG. 6. Multiplexer 636 is connected between track and hold circuitry 610c of $H_{EW}$ sampling circuitry 46 and A/D converter 612c. The integrated vertical electric field from integrater 42 of FIG. 1 is transmitted via line 66 to multiplexer 636 while the integrated magnetic field from integrator 40 is transmitted via line 68 to multiplexer 636 in response to command signals transmitted over lines 716 and 718. (See also FIGS. 9a through 9c). The processing circuitry means transmitts an A/D convert command over line 724 to A/D converter 612c via OR gate 642. At the completion of an A/D conversion the digital data is transmitted to FIFO 614c.

Assuming that the circuitry of FIG. 4 is cleared to accept data from a lightning strike, when a lightning strike occurs that is recognized by the circuitry of FIG. 4, a one hundred microsecond pulse is transmitted from one shot 462 in a manner as described previously. As the one hundred microsecond interval ends flip flop 492 is set and a high interrupt signal is transmitted therefrom via line 54 to the controller 56. This signal initiates a sample data interrupt program stored in ROM 704. The sample data interrupt program transmits an address signal via lines 716 and 718 to multiplexer 736 and a command signal via line 724 to read the integrated vertical electric field value over line 66 into A/D converter 612c where it is converted into digital form. Next the address over lines 716 and 718 is changed so that multiplexer 636 reads the integrated magnetic field value from line 68 into A/D converter 612c where it is converted into digital form. (In FIGS. 9a-9c, three separate addresses on lines 716 and 718 are required to read the integrated $H_{NS}$, $H_{EW}$ and $E_V$ fields on lines 902a,b and c). From A/D converter 612c the digital values of the electric and magnetic fields are transmitted to FIFO 614c on the rising edge of control line 634c. Next control signals are transmitted from read only memory 704 via lines 720 and 722 to decoder 620. Decoder 620 transmits a signal via line 624 to tri-state buffer 630 and processing circuitry means transmits a read sampled $H_{NS}$ data signal over line 728 to FIFO 614b. The data in FIFO 614b is then read via line 712 into the read only memory 704 and is stored in RAM 706. When all the data has been read from FIFO 614b, the signals via lines 720 and 722 are changed by the processing circuitry means so that decoder 620 transmits a signal via line 626 to tri-state buffer 632. A read sampled $H_{EW}$ data signal over line 726 from the processing circuitry means 52 causes the sampled $H_{EW}$ data stored in FIFO 614c to be transmitted via line 712 into read only memory 704 and stored in RAM 706. Finally, the signals via lines 720 and 722 from read only memory 704 are changed and the decoder 620 transmits a signal via line 622 to tri-state buffer 628 which then reads the sampled $E_V$ data in FIFO 614a along with the integrated $E_V$ and H field values on command from processing circuitry means via line 730. These also are stored in RAM 706. When all the data has been read from the FIFO 614a,b and c a Sampled Data Program is called for.

The Sample Data Program also stored in ROM 704 utilizes the sampled and integrated E and H field values of the lightning stroke to calculate the direction and to measure the range of the lightning activity.

The direction is calculated in terms of an elevation angle $\theta$ existing between the location of the lightning stroke and the antennas 10, 12 and 14; and an azimuth angle $\phi$ existing between the location of the lightning and the same antennas. As described earlier, each fast risetime pulse present in the lightning stroke triggers the circuitry described earlier to sample the E and H fields radiated by the lightning stroke. For each sample taken (where each sample corresponds to one pulse in the lightning stroke), three values $F_V$, $H_{NS}$ and $H_{FW}$ are measured by the three antenna elements. For one lightning stroke in the preferred embodiment, a maximum of 30 sets of three sampled field values are measured and stored during the first 100 microseconds.

As described earlier, the sampled field values are related by the equation, $$-H_{EW} \sin \phi + H_{NS} \cos \phi = E z/Z_0 \sin \theta$$

This equation in two unknowns can be solved by using two different threesomes of the sampled field values in the set. For example, $$\phi = \tan^{-1} \left| \frac{\frac{E_{V1}}{H_{EW1}} - \frac{E_{V2}}{H_{EW2}}}{\frac{H_{NS2}}{H_{EW2}} \cdot \frac{E_{V1}}{H_{EW1}} - \frac{H_{NS1}}{H_{EW1}} \cdot \frac{E_{V2}}{H_{EW2}}} \right| \text{ and}$$

$$\theta = \sin^{-1} \left| \frac{\frac{E_{V1}}{H_{EW1}} - \frac{E_{V2}}{H_{EW2}}}{\cos\phi \left( \frac{H_{NS1}}{H_{EW1}} - \frac{H_{NS2}}{H_{EW2}} \right)} \right|$$

Since the $\sin \theta$ must be less than 1, the bracketed expression above on the right side of the equation opposite $\theta$ must also be less than 1. If it is not the calculated $\theta$ and $\phi$ values are invalid. The Sample Data Program using the equations above for $\theta$ and $\phi$ calculates $\theta$ and $\phi$ using two threesomes of sampled field values from the set of sampled field values stored for each lightning stroke. The Sample Data Program calculates $\theta$ and $\phi$ a plurality of times for each possible combination of two different threesomes found in the set (maximum of 30 for preferred embodiment). Each time the Program calculates a $\theta$ and $\phi$ pair it checks its validity as described above. In general, all pairs of $\theta$ and $\phi$ will not agree exactly.

The Sample Data Program calculates the centroid value from the plurality of $\theta$ and $\phi$'s calculated. This is the direction angle to the lightning stroke from the equipment. Next, the Program calculates the standard deviation of the set of calculated elevation and azimuth angles, $\theta$ and $\phi$. Later it will be seen that the centroid value of $\theta$ will be used to convert the range to the projected distance on the ground to the lightning stroke. The standard deviation will be used to display the lightning activity as a region of activity rather than an isolated point. The standard deviation is stored in RAM 702.

The absolute value of the ratio of the magnetic field, H, to the electric field, E, (H/E) varies in a predictable way with the range from the lightning stroke. See FIG. 8. FIG. 8 is separated into three range regions: the near region 800 from 0 to 10 kilometers; the mid region 802 from 10 kilometers to 50 kilometers; and the far region 804 from 50 kilometers and greater. Note that H/E peaks in value at about 50 kilometers and that it is possible to have range ambiguities for values of H/E near the peak, i.e., for a given value of H/E near its peak value two possible ranges are possible, one in the far range 804 and one in the mid range 802.

The sample Data Program, stored in ROM 704, first calculates the mean value of the $F_{NS}$ field components for the lightning stroke in question from the sampled components of $H_{NS}$ that had been stored in FIFO 614b and stored in RAM 706 of the processing means. Then in similar fashion $H_{EW}$ is calculated (from the sampled values of $H_{EW}$ that had been stored in FIFO 614c). A total value, P, for the magnetic field is calculated by adding $H_{NS}$ to $H_{EW}$.

A magnetic or electric field radiated from a lightning stroke is assumed to have an initial amount of energy associated therewith. This energy attenuates as the E and H fields travel farther from the source of the lightning stroke. For example, at ten kilometers from the stroke the expected energy of the E and H fields is the initial energy minus the amount of attenuation occuring in ten kilometers. This energy can be assigned a value, K1. At 50 kilometers the expected value is K2. To determine a rough estimate, TA, of the range of the lightning strike and to help resolve the ambiguity present in the curve of FIG. 8, the Sample Data Program compares P with K1 and K2. If P is greater than K1 then the lightning stroke is close and the near range of curve 800 is used. If P is greater than K2 then the mid range is used; otherwise, the lightning stroke is in the far range.

The Sample Data Program compares the total power in the H field from the lightning stroke (as calculated from the samples of the H field stored in FIFO's 614b and 614c) with first set of predetermined range values K1 and K2 as described above.

This estimate is called TA. In a similar manner, the Sample Data Program takes the integrated H field value (as integrated by integrator 40; multiplexed by multiplexer 636; converted by A/D converter 612c; and stored in FIFO 614c until transmitted to memory 54 of the processing means) and compares it with a second set of predetermined range values K3 and K4. This comparison is used as before to estimate which range region the associated lightning stroke occured in. This estimate is called TH. The constants K1 and K2 differ from K3 and K4 because the K1 and K2 values are used with the peak pulse sampling circuitry 44, 46 and 48. The field samples measured thereby are high frequency samples of the lightning and thus are weaker at greater distances from the strike than the integrated field values which are mainly a measurement of the low frequency component of lightning. Hence, the constants K3 and K4 differ from K1 and K2.

The two estimates of range (TA and TH) are examined by the Sample Data Program to see if they agree. If the two estimates of range differ widely, that is, if one estimates is for the far range region and one, near range region, then the integrated vertical electric field (as inputted from integrator 42 in FIG. 1 through multiplexer 636, A/D converter 612c and FIFO 614c in FIG. 6) is used to estimate range by comparison with a third set of predetermined range values K5 and K6. This estimate is called TE. Values of K5 and K6 are determined by predicting the signal strength of an average lightning strike with the high frequency energy value as removed by the integrator 42. If the two estimates of range region TA and TH based on H field values are not widely different or agree then the Sample Data Program will form the H/E ratio, which will provide an accurate determination of range from FIG. 8, by using only the integrated values of the H and $E_V$ fields formed by integrators 40 and 42 respectively.

In the case where the estimates of range TA and TH differ widely, the estimate of range region based on the integrated $E_V$ field TE is compared separately with the TA estimate and with the TH estimate. If TE agrees with either TH or TA an error is presumed in the data measured by the circuitry. If TE is different from TA or TH then the H/E ratio will be formed using the field power calculated from the sampled values of the field. Of course, the Sample Data Program must first calculate the mean value of E from the sample values of E that were stored in FIFO 614a before being inputted to memory 54.

When the embodiment of FIGS. 9a through 9c is used the db value of the RMS field strengths for $H_{NS}$, $H_{EW}$ and $E_V$ are used in place of the integrated E and H field values provided via lines 66 and 68.

The near, mid and far range regions versus H/E, even numbers 800 through 804 respectively of FIG. 8, are stored as a set of three tables in memory. The H/E value formed by the Sample Data Program using either the integrated field values or the sampled field values is compared with the appropriate table to determine the corresponding range, R, of the lightning activity. This value of R is the true distance from the measuring apparatus to the lightning stroke.

It should be understood from the above description of the Sample Data Program thus far, that the method and apparatus of this invention provides circuitry and microprocessing power which uses a great deal of the detailed electromagnetic field information resulting from a lightning strike to determine accurately the range and region of activity of the lightning strikes relative to the equipment.

It is desirable to know the ground distance, D, between the observing equipment and the lightning activity. D is related to R by the Sin of the elevation angle $\theta$, that is, $$D = R \sin \theta$$

The sample Data Program will convert R to D using the centroid value of $\theta$ calculated earlier by the Program. However, D is set equal to R where R is determined from the table corresponding to the far range region since for lightning strikes that far away (greater than 50 kilometers) $\theta$ is small and Sin $\theta$ approximately equals one.

Now that the direction and distance of the storm relative to the observing equipment is calculated it must be displayed. But first, the distance calculated thus far must be adjusted for the range scale factor which is controlled by a thumb wheel switch 736 in FIG. 7. This manual selection of scale factor is monitored via lines 739 and 738 by the Schedule Routine Program stored in ROM 704. The Schedule Routine Program is executed by controller 56 every 10 milliseconds. A detailed description of the design using the INTEL 8085A for a minimum system is found in INTEL Component Data Catalog, 1980 edition, pages 6-9 through 6-24, hereby incorporated by reference as if specifically set forth herein. The controller 56 is interrupted once every 10 milliseconds by RAM 702 (the INTEL Component Data Catalog completely explains the sue of the timer output connection). The Schedule Routine Program first determines if 0, 200, 500, 700 and 900 milliseconds (10 interrupts from RAM 702 equals 100 milliseconds) has been completed. At the 0 millisecond time the range input lines are monitored over lines 738 and 739 and a signal transmitted over lines 744 and 746 which are used to adjust the switches 218, 220 and 222 in FIG. 2 to a desired input signal level that does not over saturate the circuitry or increases the apparatus sensitivity to distant lightning strikes. This range scale factor is stored in RAM 702 and is used to offset the range calculated by the Sample Data Program. The Schedule Routine Program calculates the true range on every 900 millisecond count and updates the display. This is accomplished by transmitting the x and y rectangular coordinates of the lightning and the standard deviation to the display processor 60 for display on the display means 62. The x and y coordinates are related to D and the centroid value for $\phi$ as follows:

$x = D \cdot \sin \phi$
$y = D \cdot \cos \phi$ x and y is stored in RAM 702.

The display processor is programmable and the information provided to it can be displayed and the display updated in a variety of ways. Display systems including a display processor, a display under the control of the display processor and programs for use by the display processor are commercially available along with an interface for accepting the information to be displayed. One such display system suitable for use with the present invention is a DIGITUS Corporation Rainbow 2000 System. See in particular DIGITUS Corporation users Manual which is hereby incorporated by reference as if specifically set forth herein.

One such program shows the equipment at the origin of the display with azimuth angle varying 360° about the origin. Distance is shown increasing along radials from the origin. The farther away the lightning stroke is the farther away from the origin is the indication. The uncertainty in precise distance is shown as a circle based on the value of the standard deviation of the set of $\theta$'s and $\phi$'s. It is clear from the design thus far, the range scale can be varied by the thumb wheel 736.

The programs also allows for variations in how often the display is updated with new information; how long old information; how long old information is retained; and the use of color or intensity to differentiate between intensity levels of the storm based on similarities between old and new information about the lightning activity.

The ability to locate and track electrical activity by aircraft is extremely important. In an aircraft the lightning activity is displayed relative to the heading of the aircraft. The nose of the aircraft points at zero degrees azimuth. However, the speed and direction of aircraft flight constantly changes the location of the lightning activity relative to the aircraft. To compensate for this the processing means is programmed with a Schedule Routine Program previously discussed in above paragraph, which updates the x and y coordinates of lightning activity previously displayed. Heading information from the aircraft's navigational system is transmitted via a plurality of lines 732 to synchro to digital converter (S/D) 740 in FIG. 7. The heading information is analog in nature which the synchro to digital device 740 converts to digital data when processing circuitry means transmitts a command over line 734. Model No. HXDC 10-L-3 made by ILC Data Device Company, can be used as the S/D.

The change in azimuth display, $\phi$, is calculated by the Schedule Routine Program on the 900 millisecond count by subtracting the previous heading from the newest. The change in x and y coordinates of previously detected, analyzed and displayed lightning activity (x and y) is calculated by using the calculated centroid value of $\phi c$:

$x = \text{Speed} \cdot \text{Sin } \phi c$
$y = \text{Speed} \cdot \text{Cos } \phi c$ where speed is the known speed of the aircraft stored in ROM 704 with value set in accordance to type of aircraft. For example, a Cessna 182 as a nominal cruising speed of 120 NM. In the preferred embodiment the display is updated every second.

However, the Sample Data Interrupt and Sample Data Programs will operate when triggered by randomly occuring lightning strokes. These will not always occur every tenth of a second when heading is being updated. It is desirable to use the latest heading information possible. Between display updates (every second) the Schedule Routine Program samples heading at 200, 500, 700 and 900 milliseconds. The Sample Data Program will use the latest heading information available when first calculating, $\theta$, $\phi$ and R and then will update the heading to correct the x and y coordinates before transmitting them to the display. As an example, suppose a lightning strike occurs at 450 milliseconds after the last display update by the Schedule Routine Program. The latest heading information available to the Sample Data Program is the heading information at 200 milliseconds. This information will be used by the Sample Data Program to calculate $\theta$, $\phi$ etc. However, it takes the Sample Data Program more than 50 milliseconds to acquire and calculate the information. This means that by the time the information (x and y coordinates) are ready for transmission to the display processor, the Schedule Routine Program has provided a new heading at 500 milliseconds. So, the Sample Data Program updates the newly measured and calculated x and y coordinates for the new heading using the following equations:

$\phi = \text{Heading (500 milliseconds)} - \text{Heading (200 milliseconds)}$
$x = \text{Speed} \cdot \text{Sin } \phi$
$y = \text{Speed} \cdot \text{Cos } \phi$
$x = D \cdot \text{Sin } \phi + x$
$y = D \cdot \text{Cos } \phi + y$ The display means will display x, y and the standard deviation of all calculated lightning strikes which occured since last one second update.

While the present invention has been disclosed in connection with the preferred embodiment thereof, it should be understood that there may be other embodiments which fall with the spirit and scope of the invention as defined by the following claims

I claim:

1. An apparatus for determining the location of lightning strokes, each lightning stroke generating electric (E) and magnetic (H) field components, said apparatus comprising:
    receiving means for receiving separately the electric (E) and magnetic (H) field components of a lightning stroke and for generating electrical signals associated with said E and H field components, said electrical signals being characterized by an initial rise time and a plurality of subsequent sub pulse risetimes; and
    means coupled to said receiving means for determining the distance to said lightning stroke from said apparatus by operating upon said electrical signals associated with both said E and H field components, and for determining the direction to said lightning stroke relative to said apparatus by operating upon said electrical signals associated with both said E and H field components.

2. The apparatus of claim 1 wherein the means coupled to said receiving means further comprises sampling circuit means for sampling said electrical signals whereby sample signals of said electrical signals are generated.

3. The apparatus of claim 2 wherein the means coupled to said receiving means further comprises processing means coupled to said sampling means for determining the direction to said lightning stroke relative to said apparatus in response to said sample signals.

4. The apparatus of claim 2 wherein the means coupled to said receiving means further comprises processing means for determining the distance to said lightning stroke from said apparatus in response to said sample signals.

5. The apparatus of claim 1 wherein said means coupled to said receiving means further comprises:
    integration circuit means for integrating separately over a predetermined time interval said electrical signals associated with said E and H field components, whereby integrated electrical signals are generated; and
    processing means coupled to said integration circuit means for determining the distance to said lightning stroke from said apparatus in response to said integrated electrical signals.

6. The apparatus of claim 5 wherein said processing means determines the distance to said lightning stroke from said apparatus by comparing a ratio of said integrated electrical signals to predetermined values representative of distance.

7. The apparatus of claim 1 wherein said means coupled to said receiving means further comprises:
integration circuit means for integrating separately over a predetermined time interval said electrical signals associated with said E and H field components, whereby integrated electrical signals are generated; and
processing means coupled to said integration circuit means for determining the direction to said lightning stroke relative to said apparatus in response to said integrated electrical signals.

8. The apparatus of claim 7 wherein said processing means determines the direction to said lightning stroke relative to said apparatus by comparing said integrated electrical signals with each other to determine an angle representative of direction.

9. The apparatus of claim 1 wherein said apparatus further comprises display means coupled to said means coupled to said receiving means for displaying the distance and the direction to said lightning stroke.

10. The apparatus of claim 1 wherein said receiving means comprises an electric field antenna element for receiving the electric field component of said lightning stroke and a pair of magnetic field antenna elements for receiving orthogonal components of the magnetic field component of said lightning stroke.

11. A method for determining the location of lightning strokes, each lightning stroke generating electric (E) and magnetic (H) field components, said method comprising the steps of:
separately receiving the electric (E) and magnetic (H) field components of a lightning stroke;
generating electrical signals associated with said E and H field components, wherein said electrical signals are characterized by an initial rise time and a plurality of subsequent sub pulse risetimes;
determining the distance to said lightning stroke from said apparatus by operating upon said electrical signals associated with both said E and H field components; and
determining the direction to said lightning stroke relative to said apparatus by operating upon said electrical signals associated with both said E and H field components.

* * * * *